United States Patent
Overgaard et al.

(10) Patent No.: US 12,211,571 B2
(45) Date of Patent: Jan. 28, 2025

(54) ON-DIE TESTING FOR A MEMORY DEVICE

(71) Applicant: Micron Technology, Inc., Boise, ID (US)

(72) Inventors: David W. Overgaard, Boise, ID (US); Andrew P. Lyle, Eagle, ID (US); Glen E. Hush, Boise, ID (US); Timothy P. Finkbeiner, Boise, ID (US); Kristopher J. Kopel, Boise, ID (US); Jonathan D. Harms, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 561 days.

(21) Appl. No.: 17/065,462

(22) Filed: Oct. 7, 2020

(65) Prior Publication Data

US 2022/0108761 A1    Apr. 7, 2022

(51) Int. Cl.
*G11C 29/12*   (2006.01)
*G11C 29/56*   (2006.01)
*G11C 29/04*   (2006.01)

(52) U.S. Cl.
CPC .. *G11C 29/12015* (2013.01); *G11C 29/56004* (2013.01); *G11C 2029/0403* (2013.01)

(58) Field of Classification Search
CPC ........ G11C 29/12015; G11C 29/56004; G11C 2029/0403
See application file for complete search history.

(56) References Cited

U.S. PATENT DOCUMENTS

| | | | |
|---|---|---|---|
| 2017/0117061 A1* | 4/2017 | Sharon | G11C 29/38 |
| 2020/0152255 A1* | 5/2020 | Badrieh | G11C 11/4074 |
| 2021/0081016 A1* | 3/2021 | Hovis | G06F 1/3206 |
| 2021/0104292 A1* | 4/2021 | Kim | G11C 29/88 |

* cited by examiner

*Primary Examiner* — April Y Blair
*Assistant Examiner* — Rong Tang
(74) *Attorney, Agent, or Firm* — Holland & Hart LLP

(57) ABSTRACT

Methods, systems, and devices for on-die testing for a memory device are described. In some examples, a memory die may include processing circuitry configured to perform evaluations of the memory die based on commands or instructions received from an external device. The processing circuitry may be configured to detect failures of the memory die and transmit related indications to the external device based on the on-die detection. In some examples, the processing circuitry may be configured to communicate failure information at a finer granularity than information associated with expected or nominal behavior. Additionally or alternatively, the processing circuitry may be configured to perform operations according to an internally-generated clock signal that operates at a faster rate or speed than a clock signal from the external device. In some examples, the processing circuitry may include an analog-to-digital conversion capability for digital communication of analog characteristics internal to the memory die.

23 Claims, 6 Drawing Sheets

ON-DIE TESTING FOR A MEMORY DEVICE

BACKGROUND

The following relates generally to one or more systems for memory and more specifically to on-die testing for a memory device.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
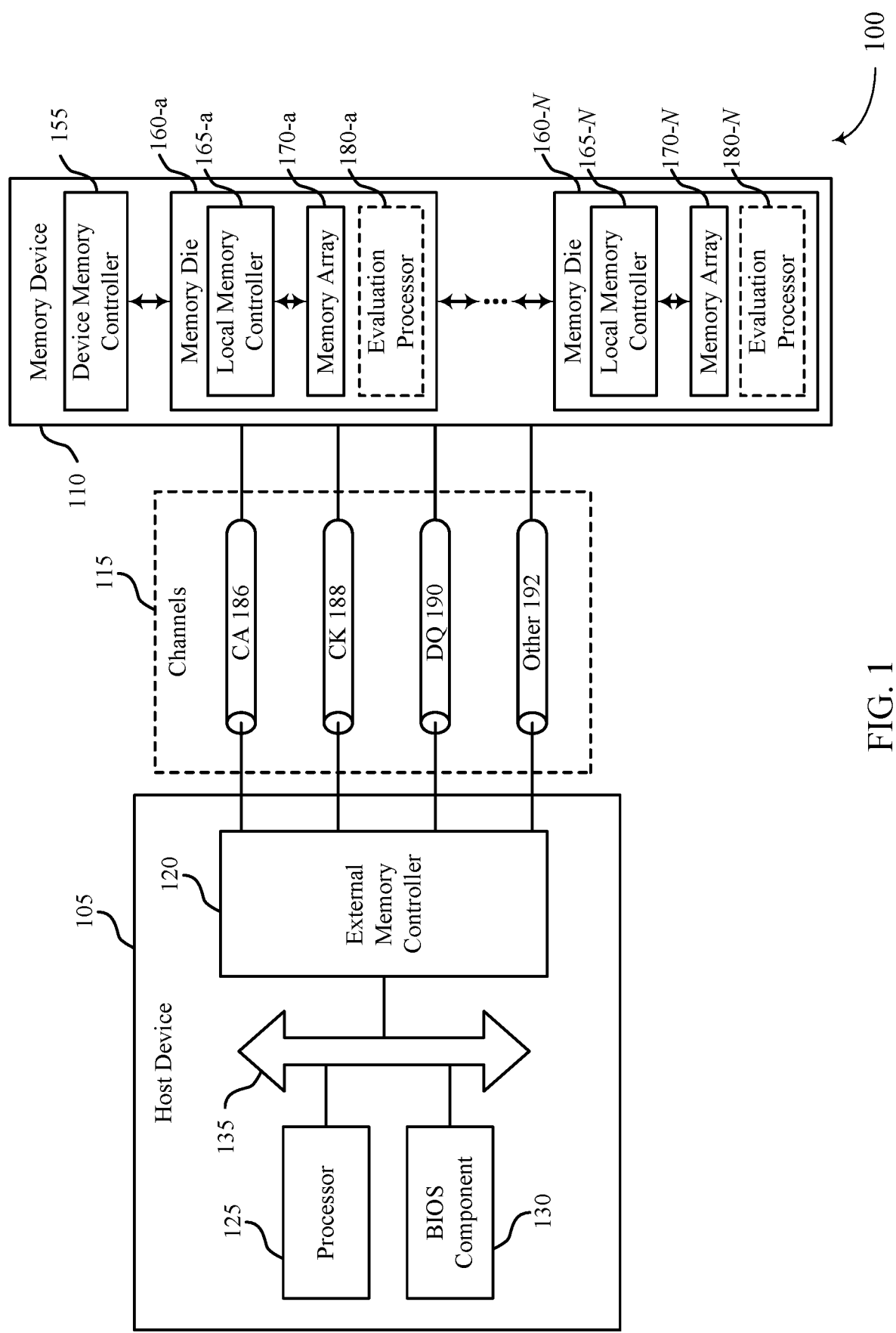
FIG. 1 illustrates an example of a system that supports on-die testing for a memory device in accordance with examples as disclosed herein.

In some memory systems, a memory die (e.g., a memory chip, a semiconductor chip including an array of memory cells) may be evaluated for various criteria. Such evaluations may be performed as a die qualification, a wafer qualification, a manufacturing validation, or a component-level or subcomponent-level confirmation or calibration, among other evaluations. Evaluations of a memory die may include comparisons against acceptance thresholds (e.g., associated with die or wafer acceptance or rejection), identification of whether parameters are within one or more ranges (e.g., associated with sorting dies into performance categories), or evaluations of performance characteristics for establishing calibration settings (e.g., for setting trim values or register values of a memory die, for setting fuses or anti-fuses of a memory die, for electrically or logically mapping components of the memory die), and other types of evaluations.

In some examples, evaluations may be performed before a memory die is assembled in or operated with an end product. For example, after a manufacturing operation to fabricate a memory die or associated semiconductor wafer, an evaluation device may be communicatively coupled with a memory die via one or more contacts of the memory die, where such contacts may be couplable to a bonding pad, a data bus, a command/address, or various combinations thereof. The evaluation device may initiate evaluation operations by sending commands via the one or more contacts, and may process results of the evaluation operations based on information received from the memory die via the one or more contacts. In some cases, however, communication via contacts of a memory die and evaluations by an external device may be associated with various limitations. For example, such techniques may be associated with practical limitations related to types of evaluation operations that may be performed, durations or speeds associated with performing evaluation operations, quantities of memory dies that may be evaluated (e.g., evaluated simultaneously or concurrently), or granularity of information that may be communicated or processed in evaluation operations, among other limitations.

In accordance with examples as disclosed herein, a memory die may be fabricated with processing capabilities that support aspects of memory die evaluations being performed on the memory die. For example, a memory die may include on-die processing circuitry configured to perform evaluations based on commands or instructions received from an external device. In some examples, the processing circuitry may be configured to detect failures of the memory die based on performing the evaluations, and transmit indications of the failures to the external device based on the on-die detections. In some examples, the processing circuitry may be configured to communicate failure information at a finer granularity or resolution than information associated with expected or nominal behavior or outcome, which may support repairs or reconfigurations being performed at a relatively finer granularity without undue communication overhead (e.g., without unnecessary granularity for expected or nominal behavior or outcomes). The processing circuitry may be configured to perform operations according to an internally-generated clock signal, which may operate at a faster rate or speed than a clock signal communicated with the external device. In some examples, the processing circuitry may additionally or alternatively be configured for detecting other types of data (e.g., evaluation data, characterization data) that may or may not be related to failures of a memory die. For example, the processing circuitry may be configured to support detecting or communicating timing information, frequency information, or other information associated with an operational evaluation of a memory die. In some examples, the processing circuitry may include an analog-to-digital conversion capability to support communicating digital indications of analog characteristics (e.g., voltage, current, charge) internal to the memory die. By implementing on-die processing capabilities in accordance with examples as disclosed herein, a memory die may be fabricated in a manner that supports improved flexibility for evaluation techniques, higher evaluation throughput, improved quality or resolution of evaluation information, or improved quality or resolution of repairs or reconfigurations, among other benefits or combinations thereof.

Features of the disclosure are initially described in the context of systems and dies as described with reference to FIGS. 1-3. These and other features of the disclosure are further illustrated by and described with reference to an apparatus diagram and flowcharts that relate to on-die testing for a memory device as described with reference to FIGS. 4-6.

FIG. 1 illustrates an example of a system 100 that supports on-die testing for a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips, semiconductor chips) to support a desired capacity or a specified capacity for data storage. Each memory die 160 may include a local memory controller 165 (e.g., local memory controller 165-a, local memory controller 165-N) and a memory array 170 (e.g., memory array 170-a, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

A memory die 160 may be evaluated (e.g., tested) for various criteria, which may be associated with a die qualification, a wafer qualification, a manufacturing validation, or a component-level or subcomponent-level confirmation or calibration, among other evaluations. In some examples, evaluations may be performed before a memory die 160 is assembled in or operated with a memory device 110 or host device 105. For example, after a manufacturing operation to fabricate a memory die 160 or associated semiconductor wafer, an evaluation device may be communicatively coupled with a memory die 160 (e.g., directly coupled) via one or more contacts of the memory die 160, where such contacts may be couplable to a bonding pad, a data bus, a command/address, or various combinations thereof (e.g., contacts for communicative coupling with a device memory controller 155, contacts dedicated for supporting evaluation operations). An evaluation device may initiate evaluation operations by sending commands via the one or more contacts, and may process results of the evaluation operations based on information received from the memory die 160 via the one or more contacts. In some cases, however, communication via contacts of a memory die 160 or evaluations by an external device may be associated with various limitations. For example, such techniques may be associated with practical limitations related to types of evaluation operations that may be performed, durations or speeds associated with performing evaluation operations, quantities of memory dies 160 that may be evaluated concurrently, or granularity of information that may be communicated or processed in evaluation operations, among other limitations.

In accordance with examples as disclosed herein, a memory die 160 may include an evaluation processor 180 that supports aspects of evaluations being performed on the memory die 160 (e.g., in response to a command from an external device, such as an evaluation device). In some examples, an evaluation processor 180 may be configured to support detecting failures or other operational characteristics of the memory die 160 based on the evaluations, and transmitting indications of the failures or other operational characteristics to an external device based on the on-die detections. In some examples, an evaluation processor 180 may be configured to support communicating failure information at a finer granularity or resolution than information associated with expected or nominal behavior. In some examples, an evaluation processor 180 may be configured to support performing operations according to an internally-generated clock signal, which may operate at a faster rate or speed than a clock signal communicated with an external device. In some examples, an evaluation processor 180 may be additionally or alternatively configured for detecting other types of information (e.g., evaluation data, characterization data) that may or may not be related to failures of a memory die 160. For example, the processing circuitry may be configured to support detecting or communicating timing information, frequency information, or other information associated with an evaluation of operational behavior of a memory die 160. Further, in some examples, an evaluation processor 180 may be configured to support an analog-to-digital conversion capability for communicating digital indications of analog characteristics (e.g., voltage, current, charge) internal to the memory die 160. Although the evaluation processors 180 are illustrated as being separate from local memory controllers 165, in some examples, an evaluation processor 180, or some portion or subcomponent thereof, may be included in or incorporated in a local memory controller 165. By including an evaluation processor 180 in accordance with examples as disclosed herein, a memory die 160 may be fabricated in a manner that supports improved flexibility for evaluation techniques, higher evaluation throughput, improved quality or resolution of evaluation information, or improved quality or resolution of repairs or reconfigurations, among other benefits or combinations thereof.

Figure 2:
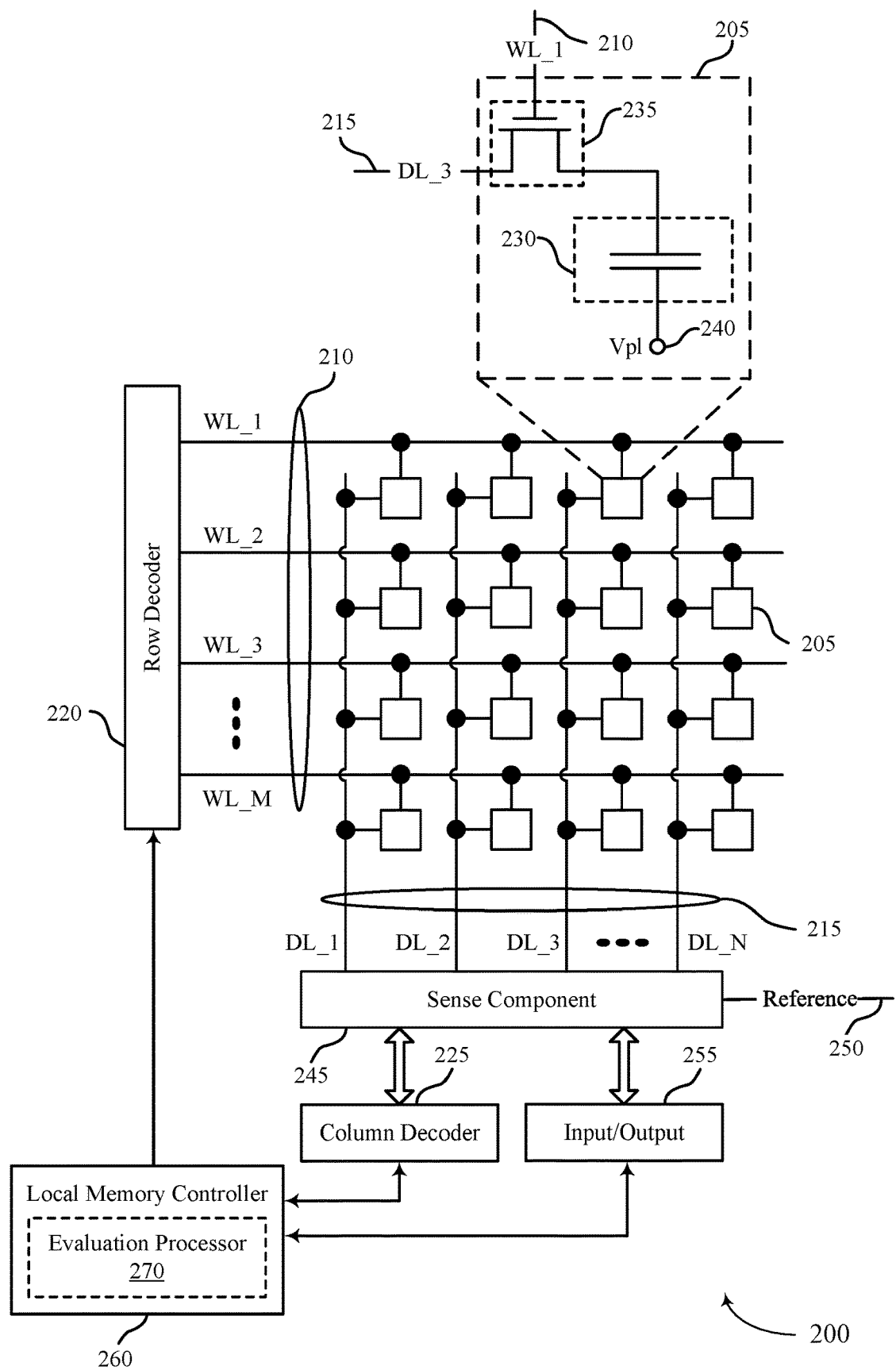
FIG. 2 illustrates an example of a memory die that supports on-die testing for a memory device in accordance with examples as disclosed herein.

FIG. 2 illustrates an example of a memory die 200 that supports on-die testing for a memory device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss. Although the illustrated memory die 200 includes a capacitive memory architecture, the described techniques for on-die testing for a memory device may be applied with other memory architectures, including memory dies with chalcogenide memory cells, thresholding memory cells, phase change memory cells, resistive memory cells, NAND memory cells, and others.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be operable to couple and/or isolate the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

The memory die 200 may be evaluated for various criteria, which may be associated with a die qualification, a wafer qualification, a manufacturing validation, or a component-level or subcomponent-level confirmation or calibration, among other evaluations. For example, after a manufacturing operation to fabricate the memory die 200 or associated semiconductor wafer, an evaluation device may be communicatively coupled with the memory die 200 (e.g., directly coupled) via one or more contacts of the memory die 200 (e.g., of the input/output 255, of the local memory controller 260, of the evaluation processor 270), where such contacts may be couplable to a bonding pad, a data bus, a command/address, or various combinations thereof. An evaluation device may initiate evaluation operations by sending commands via the one or more contacts, and may process results of the evaluation operations based on information received from the memory die 200 via the one or more contacts. In some cases, however, communication via contacts of the memory die 200 to support evaluations by an external device may be associated with various evaluation limitations.

In accordance with examples as disclosed herein, the memory die 200 may include an evaluation processor 270 that supports aspects of evaluations being performed on the memory die 200 (e.g., in response to a command from a device external to the memory die 200). The evaluation processor 270 may be an example of aspects of an evaluation processor 180 described with reference to FIG. 1, and may be configured to support detecting failures or other characterization information of the memory die 200 based on the evaluations, and transmitting indications of the failures or other characterization information to an external device. In some examples, the evaluation processor 270 may be configured to support communicating failure information at a finer granularity or resolution than information associated with expected or nominal behavior of the memory die 200. In some examples, the evaluation processor 270 may be configured to support performing operations according to an internally-generated clock signal, which may operate at a faster rate or speed than a clock signal communicated with an external device. In some examples, the evaluation processor 270 may be configured for detecting other types of information (e.g., evaluation data, characterization data) that may or may not be related to failures of a memory die. For example, the evaluation processor 270 may be configured to support detecting or communicating timing information, frequency information, or other information associated with an operational evaluation of the memory die 200 (e.g., for characterizing behavior of circuitry internal to the memory die 200). Further, in some examples, the evaluation processor 270 may be configured to support an analog-to-digital conversion capability for communicating digital indications of analog characteristics (e.g., voltage, current, charge) internal to the memory die 200, such as a digital indication of voltage levels of one or more voltage sources or regulators of the memory die 200. Although the evaluation processor 270 is illustrated as being included in the local memory controller 260, in some examples, an evaluation processor 270, or some components or functions thereof, may be separate from or outside a local memory controller 260 (e.g., the evaluation processor 270 may be coupled with local memory controller 260). By including an evaluation processor 270 in accordance with examples as disclosed herein, a memory die 200 may be fabricated in a manner that supports improved flexibility for evaluation techniques, higher evaluation throughput, improved quality or resolution of evaluation information, or improved quality or resolution of repairs or reconfigurations, among other benefits.

Figure 3:
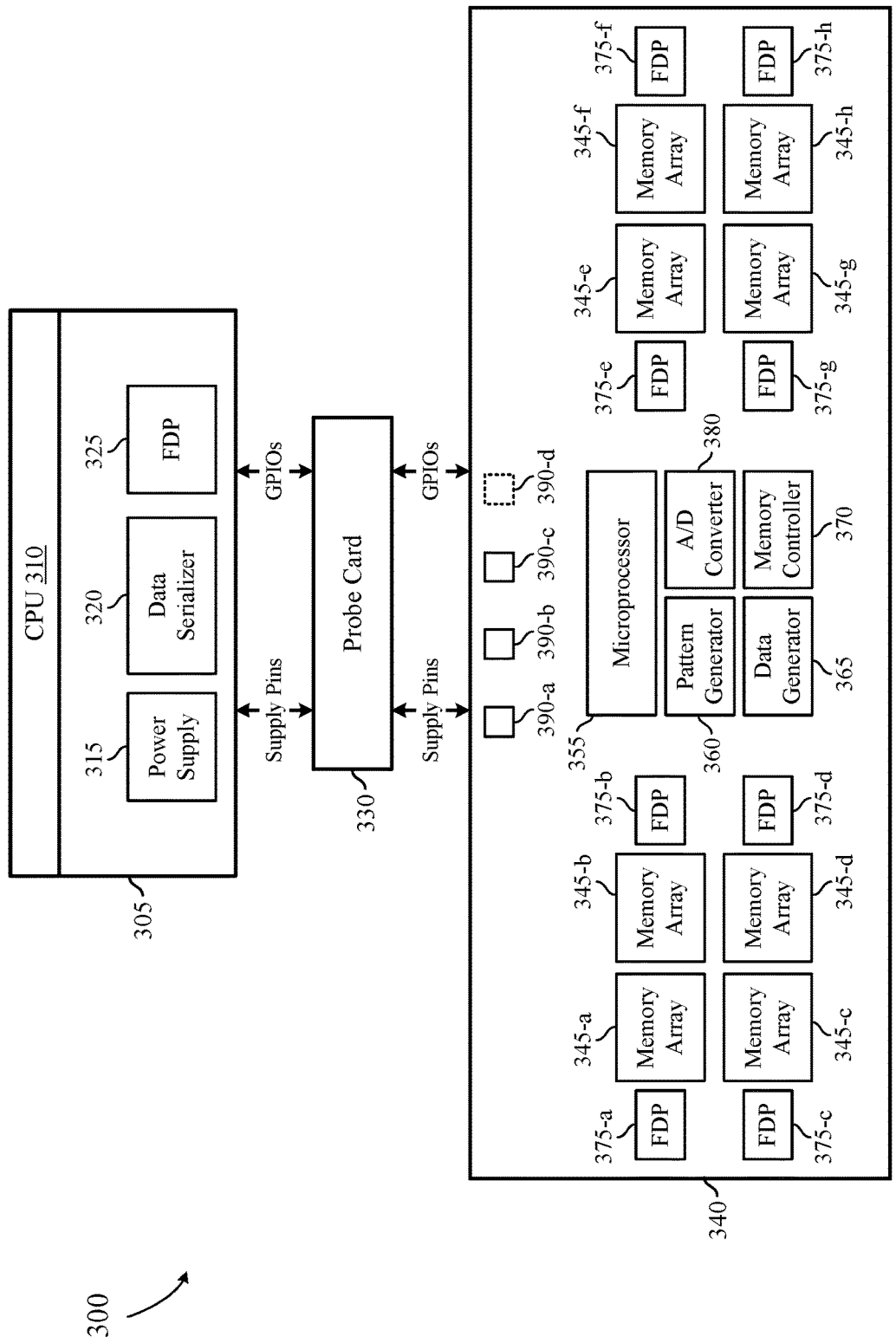
FIG. 3 illustrates an example of a system that supports on-die testing for a memory device in accordance with examples as disclosed herein.

FIG. 3 illustrates an example of a system 300 that supports on-die testing for a memory device in accordance with examples as disclosed herein. The system includes a memory die 340, which may be an example of a memory die 160 or a memory die 200 as described with reference to FIGS. 1 and 2. The memory die 160 may include a set of memory arrays 345 (e.g., banks, sections, decks), which may be examples of a memory array 170 as described with reference to FIG. 1, and a memory controller 370, which may be an example of a local memory controller 165 or a local memory controller 260 described with reference to FIGS. 1 and 2. Although not illustrated in the example of system 300, the memory die 340 may include one or more of a row decoder 220, a column decoder 225, a sense component 245, or an input/output 255, or various combinations thereof, as described with reference to FIG. 2. The system 300 also includes an evaluation device 305 (e.g., an evaluation apparatus) that may support aspects of evaluating the memory die 340. In some examples, the system 300 may include a probe card 330 for coupling with one or more memory dies including the memory die 340. In various examples, the probe card 330 may be separate from the evaluation device 305, or may be included in the evaluation device 305.

The evaluation device 305 may be an example of a device or other testing infrastructure configured for evaluating the memory die 340, which may be associated with a die qualification, a wafer qualification, a manufacturing validation, or a component-level or subcomponent-level confirmation or calibration, among other evaluations. The evaluation device 305 may include a central processing unit (CPU) 310 configured for processing or generating evaluation commands (e.g., for transmitting to the memory die 340), processing or evaluating information received from the memory die 340, interacting with a user or other manufacturing equipment, and other operations. The evaluation device 305 may include a power supply 315 for powering the memory die 340 or the probe card 330 during various evaluations. In some examples, the evaluation device 305 may include a data serializer 320 for serializing or deserializing information (e.g., write bursts, read bursts) exchanged between the memory die 340 and the evaluation device 305, and a fail data processor (FDP) 325 to support evaluations of failures or other behaviors of the memory die 340, or characterizing components or circuitry thereof, including those related to the memory die 340 writing data to the memory arrays 345, maintaining data at the memory arrays 345, or reading data from the memory arrays 345.

The evaluation device 305 may be communicatively coupled with the memory die 340 via one or more supply pins and one or more general-purpose input/output pins (GPIOs), among other communicative or electrical coupling. In some examples, such coupling may be provided via the probe card 330. Although a single memory die 340 is illustrated, the system 300 may support a coupling of more than one memory die 340 with an evaluation device 305 or probe card 330. In a non-limiting example, an evaluation device 305 or probe card 330 may support coupling with three thousand memory dies 340, which may be included in one or more semiconductor wafers that may be concurrently evaluated. In such an example, a probe card 330 may include three thousand or more supply pins and three thousand or more GPIOs for coupling with memory dies. In various examples, an evaluation device 305 may also include three thousand or more supply pins and three thousand or more GPIOs, or a probe card 330 may support various techniques for multiplexing, parallelization, or serialization, such that the evaluation device 305 may support fewer supply pins or fewer GPIOs than between a probe card 330 and a set of memory dies for evaluation.

To support evaluations of the memory die 340, the probe card 330 may be physically and electrically coupled with contacts 390 (e.g., pins, terminals, pads) of the memory die 340, where the contacts 390 may refer to exposed portions of the memory die 340 configured for coupling with a bonding pad, a data bus, or a command/address interface, among other configurations. The coupling between the probe card 330 and the contacts 390 may be referred to as a "touchdown" or "probe" operation, which may be associated with a temporary coupling or contact that supports various evaluations one or more memory dies (e.g., of a semiconductor wafer) including the memory die 340. In some examples, the contacts 390 of the memory die 340 may refer to contacts that are dedicated to evaluation operations (e.g., used during the touchdown or probe operation but not for communication with a device memory controller 155 or a host device 105). In some examples, the contacts 390 may refer to contacts that are used for both the touchdown or probe operation and for communication with a device memory controller 155 or a host device 105 (e.g., over a channel 115), or for other operative communication, power supply, or other functions.

The contacts 390 may be configured according to various techniques that support the evaluation of the memory die 340. For example, the memory die 340 may include one or more GPIO contacts 390-a configured for communicating information (e.g., data, control information, commands, as one or more DQ contacts) between the memory die 340 and the evaluation device 305. The memory die 340 may also include one or more power supply contacts 390-b configured for the evaluation device 305 (e.g., the power supply 315) or probe card 330 to supply power to the memory die 340 according to one or more supply voltages. In some examples, the memory die 340 may include a power supply contact 390-b that is biased to or maintained at a ground or other reference voltage, and a respective power supply contact 390-b that is biased to each of one or more supply voltages (e.g., VDD, VCCP), which may correspond to supply voltages that would be provided by a host device 105 in an assembled or integrated condition of the memory die 340. In some examples, the memory die 340 may include one or more clock signal contacts 390-c configured to provide clock signals to the memory die 340 according to one or more clock frequencies. A provided clock signal may be associated with one or more frequencies that would be provided by a host device 105 in an assembled or integrated condition of the memory die 340 (e.g., a CLK signal or CK signal provided via a CK channel 188), which may support evaluating performance of the memory die 340 at different clock frequencies or sorting memory dies according to operation at different speeds. In some examples, the memory die 340 may include a chip select contact 390-d configured to select, deselect, enable, disable, or reset the memory die 340 (e.g., to perform an asynchronous reset), or indicate which test the memory die 340 should perform (e.g., to signal programming of a next pattern, to program a variable length test), or program a controller of the memory die 340, among other operations or indications.

The system 300 may be configured for evaluation efficiency, which may consider a duration of evaluating memory dies, a degree of parallelism (e.g., a quantity of memory dies that may be evaluated concurrently), a cost of the evaluation infrastructure (e.g., a cost of an evaluation device 305 or probe card 330), among other considerations. For example, to support a high degree of parallelism, the evaluation device 305 or probe card 330 may be configured to support evaluation using communications via relatively few GPIO contacts 390-*a*, or with relatively few touchdown operations on the memory die 340, or both. In some examples, to support relatively fast evaluations, a clock frequency of the evaluation device 305 may relatively fast, or evaluation information (e.g., read information), may be relatively compressed (e.g., to a relatively coarser granularity that may be transferred more quickly).

In some examples, improvements for evaluating the memory die 340 may be associated with practical limitations or tradeoffs related to processing of evaluation information at an evaluation device 305, or communicating information between the evaluation device 305 and the memory die 340 (e.g., bottlenecks of the probe card 330), or both. For example, some operations may already be performed with a single touchdown operation or with communications via a single GPIO contact 390-*a*, which may be associated with a practical limitation for parallelism. In some examples, a quantity of power supply pins or GPIOs of an evaluation device 305 or a probe card 330 may be associated with cost or practical limitations that do not support increasing a quantity of interconnections at a probe card 330 or evaluation device 305. In some examples, a clock rate may be associated with practical limitations, where increasing rates may not be supported by a threshold signal integrity for communications between the memory die 340 and the evaluation device 305. Further, although evaluation information communicated between the evaluation device 305 and the memory die 340 may be compressed to reduce a volume of such information, such compression may be associated with weakened, degraded, or otherwise suboptimal evaluation or repair solutions (e.g., performing repairs or component remapping at a relatively coarse granularity), which may be associated with reduced yields.

In accordance with examples as disclosed herein, the memory die 340 may include various processing circuitry configured to perform aspects of operational evaluations at the memory die 340. For example, the memory die 340 may include a microprocessor 355, a pattern generator 360, a data generator 365, one or more FDPs 375, or an analog-to-digital (A/D) converter 380, or various combinations thereof, which may be examples of components or circuitry of an evaluation processor 180 or of an evaluation processor 270 as described with reference to FIGS. 1 and 2. In various examples, one or more of such components or circuits may perform operations responsive to commands received from the evaluation device 305 (e.g., via the probe card 330), and may communicate associated evaluation information to the evaluation device 305 (e.g., via the probe card 330).

The microprocessor 355 may be an example of a general-purpose processor, an embedded processor, a field-programmable gate array (FPGA), or other logic or circuitry integrated in the memory die 340 (e.g., physically formed in a same semiconductor chip or portion of a semiconductor wafer as the memory die 340) that is configured to process commands or information related to evaluation of operations of the memory die 340. In some examples, the microprocessor 355 may be preconfigured with logic, circuitry, or instructions (e.g., stored in a storage component of the memory die 340 and accessible for execution by the microprocessor 355) for performing or initiating evaluation operations in response to commands from the evaluation device 305. Additionally or alternatively, the microprocessor 355 may receive instructions (e.g., code, software) from the evaluation device 305, or another programming device, where the received instructions may be executed in response to various commands from the evaluation device 305. In some examples, supporting instruction loading may enable various design for test (DFT) techniques to be developed after the memory die 340 has been manufactured, or may enable obscuring or otherwise protecting the security of particular test routines. Various implementations of the microprocessor 355 or other supporting evaluation components may enable a 2-pin or 3-pin command, address, and I/O interface, (e.g., a configuration with one GPIO contact 390-*a* and one clock signal contact 390-*c*, a configuration with one GPIO contact 390-*a*, one clock signal contact 390-*c*, and one chip select contact 390-*d*), which may support relatively lower-cost probe cards 330 compared to configurations with a greater quantity of contacts 390 per memory die. In some examples, the described techniques may support communication using relatively few GPIO contacts 390-*a* (e.g., a single GPIO contact 390-*a*), and the microprocessor 355 may support various techniques for parallelization within the memory die 340 for efficient evaluations.

In some examples, the microprocessor 355 may include or be otherwise associated with a clock signal generator of the memory die 340, which may be configured for generating a clock signal having a faster frequency than a clock signal received from the probe card 330 or evaluation device 305 (e.g., multiplying a rate of a clock signal received via a clock signal contact 390-*c*). In some examples, the microprocessor 355 may support communication or processing (e.g., modulating, demodulating, interpreting) of commands or information exchanged between the memory die 340 and the evaluation device 305 or probe card 330 using a clock signal associated with a clock signal contact 390-*c* (e.g., a CLK signal, a master clock for the microprocessor 355), which may have a relatively slower frequency that supports relatively higher communication signal integrity. In some examples, components of the memory die 340 may be configured to perform operations internal to the memory die 340 (e.g., write operations, read operations, comparison operations, evaluation operations) at a relatively faster frequency of the internally-generated clock signal, which may support evaluation operations being performed relatively quickly. By implementing different clock rates for different techniques or operations, the microprocessor 355 may advantageously decouple considerations related to signal integrity and speed as related to clock rates.

The circuitry of the memory die 340 may be configured to perform various evaluation operations on the memory arrays 345, such as generating patterns of logic states to be written to the memory arrays 345, reading logic states back from memory arrays 345 that have been written, biasing access lines according to prescribed patterns, and other operations for evaluating performance of components of the memory die 340 used for accessing the memory arrays 345. Some such techniques may be supported by the microprocessor 355, a pattern generator 360, a data generator 365, a memory controller 370, or combinations thereof. In some examples, generating evaluation patterns at the memory die 340 (e.g., rather than the evaluation device 305) may support improved access to information, such as access to an entire prefetch of a memory array 345 for native read bursts or write bursts, which may alleviate signaling constraints between the memory die 340 and the evaluation device 305 or probe card 330. In some examples, generating evaluation patterns at the memory die 340 may reduce or eliminate some read bursts or write bursts between the memory die 340 and the evaluation device 305 that would otherwise be involved in performing evaluations. Evaluation patterns, such as patterns of biasing access lines or memory cells, may be associated with accessing or operating the memory arrays 345 in a physical manner (e.g., excluding logical inversions or logical address mapping), which may support evaluating physical structures of the memory arrays 345 for such characteristics as dielectric performance, charge leakage, circuit discontinuities, and other electrical phenomena.

In some examples, the memory die 340 may include a pattern generator 360 configured to generate evaluation patterns (e.g., logic state patterns, charge state patterns, bias patterns, a pattern of signals to effect read or write operations) to be applied to one or more of the memory arrays 345. The pattern generator 360 may load patterns from a register of the memory die 340 (e.g., instead of communicating a pattern via a GPIO contact 390-a), or generate patterns based on a command from the evaluation device 305, or both. In some examples, the pattern generator 360 may generate patterns for adjacent access lines or memory cells to have opposite polarities, or some other stimulus, to evaluate whether a particular failure or phenomenon exists in a memory array 345. In some examples, the pattern generator 360 may be configured to generate patterns that are not normally performed or supported by the memory die 340 (e.g., patterns different than those used by the memory controller 370 for normal operations outside of a testing context) to impose unique stresses or interact with memory arrays 345 in an otherwise atypical manner. For example, the pattern generator 360 may concurrently activate multiple (e.g., all) word lines of a memory array 345 to observe some conditions (e.g., failure conditions, operational characterizations) such as evaluating leakage conditions of a memory array 345, or to simultaneously write to multiple rows. In another example, the pattern generator 360 may be configured to perform an iterative accessing such as writing logic states to a first row, reading the logic states from the first row to copy them to a second row, and so on, which may support an evaluation of data movement quality of a memory array 345.

In some examples, the memory die 340 may include a data generator 365, which may be configured to handle more complex backgrounds of logic states, logic state inversion, scrambling, logical or physical address mapping, and other functions. For example, the data generator 365 may receive access patterns from the pattern generator 360 (e.g., logical access patterns), and generate access patterns (e.g., physical access patterns) that are applied to one or more memory arrays 345 for various evaluations. In some examples, such pattern generation may be based on one or more registers of the data generator 365 that track aspects of address mapping, inversion, or scrambling of a memory array 345.

In various examples, access patterns from a pattern generator 360 or a data generator 365 may be provided to the memory controller 370 for performing various biasing or activations of the memory arrays 345, or access patterns of a pattern generator 360 or a data generator 365 may bypass the memory controller 370 and be applied to the memory arrays 345 directly (e.g., to support operations not normally supported by or performed by the memory controller 370). In some examples, access patterns may be applied to multiple memory arrays 345 concurrently, which may support a degree of parallelism that may not be available when receiving access patterns from an evaluation device 305, or when lacking evaluation processing circuitry in accordance with examples as disclosed herein.

The memory die 340 may also include one or more FDPs 375, which may be configured for comparing read states with write states (e.g., expected states) to evaluate the ability of a memory array 345 to store, maintain, or read information. In the illustrated example, each memory array 345 is associated with a respective FDP 375, but a memory die 340 may include any quantity of one or more FDPs 375, which may leverage various degrees of parallelism. In some examples, an FDP 375 may be an on-die comparator, which may compare information read from a memory array 345 to expected information, and provide a readback when there is a mismatch or difference. In various examples, the FDP 375 may be configured to provide a digital indication (e.g., a true or false indication) of whether one or more mismatches were detected, a quantity of how many mismatches were detected, an address associated with one or more mismatches, addresses having a highest quantity of mismatches, or various other indications.

By including one or more FDPs 375 in the memory die 340, evaluations may be performed within the memory die 340 in a manner that reduces information communication with the evaluation device 305. For example, in some evaluation techniques, a failure bitmap may be created with indications of failure locations (e.g., each failed memory cell, each failed address). When an FDP 325 of the evaluation device 305 performs evaluations to generate such a bitmap, all read information may be communicated from the memory die 340 to the evaluation device 305 (e.g., via a GPIO contact 390-a). When an FDP 375 or the memory die 340 performs such comparisons, the FDP 375 or the microprocessor 355 may be configured to indicate failures (e.g., rather than all read information), which may substantially reduce communications between the memory die 340 and the evaluation device 305 for a failure bitmap of the same granularity. Such techniques may be combined with parallel writes or parallel reads across a plurality of memory arrays 345, which may support further benefits in parallelism. In some examples, such techniques may support the FDP 325 of the evaluation device 305 determining failure bitmaps, repairs, calibrations, or sorting without the processing load of also performing comparisons between read data and expected data.

In some examples, the microprocessor 355 may be configured to perform a selective compression of evaluation information (e.g., a selective compression of fail data or success data), which may reduce communications overhead between the evaluation device 305 and the memory die 340. For example, when an evaluation operation indicates a successful or nominal operation, the microprocessor 355 may be configured to communicate (e.g., via a GPIO contact 390-a) the information at a relatively coarse granularity, and when an evaluation operation indicates an unsuccessful or failed operation (e.g., indicating a failure or adverse operation of one or more components of the memory die 340), the microprocessor 355 may be configured to communicate the information at a relatively fine granularity.

In an illustrative example, the microprocessor 355 may be configured to indicate failure information according to a granularity of a column or row of memory cells 205 (e.g., that one or more memory cells 205 of a row or one or more memory cells 205 of a column has failed, that a word line 210 or a digit line 215 of a memory array 345 is associated with a failed operation or some other characteristic that does not meet a threshold). Such an approach may support the evaluation device 305 performing or initiating repairs of the memory die 340 according to the relatively fine granularity used for communicating the failure information. For example, the evaluation device 305 may configure the memory die 340 with logical or physical address mapping according to a granularity of rows or columns (e.g., a repair mapping that maps addresses to spare rows or columns in order to avoid rows or columns associated with an indicated failure), or selectively idle or disable portions of a memory array 345 according to the rows or columns associated with indicated failures, or assign the memory die 340 with an available capacity that considers a functional removal of one or more rows or columns associated with an indicated failure (e.g., from a total nominal capacity for a given memory die design). According to these and other examples, the communication of failure information using a relatively fine granularity may support relatively higher memory die yields compared to configurations that communicate failure information at relatively coarser granularity.

The microprocessor 355 may be configured to use a different granularity or other communication scheme when identifying successful or nominal operations of the memory die 340, which may include various techniques for preprocessing or summarizing results before they are communicated to the evaluation device 305. In some examples, the microprocessor 355 may be configured to indicate successful or nominal operation according to a granularity of a memory array 345 (e.g., that a memory array 345 as a whole is operating successfully or nominally), according to a granularity of a section of multiple rows, multiple columns, or a combination thereof, according to granularity of a level or deck of memory cells 205, or some other granularity that is coarser than a granularity associated with successful or nominal operation. In some examples, the microprocessor 355 may be configured to refrain from sending information regarding successful or nominal operation altogether, in which case the evaluation device 305 may infer or assume successful or nominal operation to further reduce communication overhead between the evaluation device 305 and the memory die 340.

Although some examples of evaluations of the memory die 340 described herein may be related to or characterized as failure evaluations, or involve the generation of or communication of failure information, techniques in accordance with examples as disclosed herein may be applied more generally to various evaluations or characterizations of the memory die 340 that may or may not be associated with failures (e.g., for various techniques of characterizing behavior of circuitry internal to the memory die 340). For example, the microprocessor 355 or other component of the memory die 340 may be configured for evaluating or characterizing other information of the memory die 340, such as timing information, frequency information, signaling information (e.g., voltage information, charge information, current information) or other information that may support the evaluation, characterization, or sorting of the memory die 340, or component or circuitry thereof. In some examples, timing information may be related to delays or timing for performing various access operations (e.g., related to one or more delay components or circuits of the memory die 340), or timing margins for developing access operation signaling relative to a configured timing sequence. In some examples, frequency information may be related to a frequency of a clock signal generated internally by the memory die 340, which may be based on a clock signal received at the memory die 340 or based on an internal oscillator of the memory die 340. For example, the memory die 340 may support measuring or evaluating an internal oscillator of the memory die 340 based on a frequency calculation or a readout of a counter that counts transitions of the internal oscillator, which may be processed or evaluated by the microprocessor 355. In some examples, signaling information may be related to signal levels themselves, or a comparison or margin of a signal level to a reference signal or acceptable range for a signal.

In some examples, characterization information or evaluation information may be provided to the evaluation device 305, which may support the calibration or sorting of the memory die 340 by the evaluation device 305, or may support feedback to a fabrication process for adapting or fine tuning the fabrication process for fabricating a different memory die 340. For example, the evaluation device 305 may be configured to enable or disable related components or circuitry of the memory die 340 (e.g., in a repair or configuration command transmitted to the memory die 340, in a repair or configuration setting written to the memory die 340).

Additionally or alternatively, evaluation information or characterization information may be processed at the memory die 340 (e.g., by the microprocessor 355) for evaluating the performance of one or more components of the memory die 340, or for configuring or calibrating one or more components of the memory die 340 (e.g., by the microprocessor 355). For example, the memory die 340 (e.g., the microprocessor 355) may be configured to enable, disable, or configure one or more components or circuits of the memory die 340 based on such evaluation information or characterization information, which may or may not be accompanied by a signaling of such settings to the evaluation device 305.

In an illustrative example, based on an evaluation or characterization of one or more sense amplifiers of the memory die 340, the memory die 340 may be written with or commanded with a sense amplifier configuration. In some examples, such a configuration may be associated with a selective enabling of certain ones of the sense amplifiers (e.g., one or more sense amplifiers operating within a nominal range or operating in an otherwise acceptable manner). In some examples, such a configuration may be associated with a selective disabling of certain ones of the sense amplifiers (e.g., one or more sense amplifiers operating outside a nominal range or operating in an otherwise unacceptable manner). In some examples, such a configuration may be associated with configuring or calibrating one or more sense amplifiers with a particular setting (e.g., a voltage setting, a timing setting, a configuration of one or more delay components associated with sensing operations, a logical mapping).

Thus, in accordance with various examples of the described techniques, the memory die 340 (e.g., the microprocessor 355) may be configured with a capability to process raw data to support evaluations or responsive operations at the memory die 340, to support evaluations or responsive operations at the evaluation device 305, or to support evaluations and responsive operations performed by a combination of operations of the memory die 340 and the evaluation device 305.

In some examples (e.g., to support the communication of evaluation information or characterization information to an evaluation device 305), the memory die 340 may include an on-board or embedded A/D converter 380, which may support converting an analog signal (e.g., an analog measurement internal to the memory die 340) to a digital value or indication (e.g., a parametric value). For example, as part of an evaluation operation, an A/D converter 380 may be coupled with a voltage source or voltage regulator of the memory die 340 that is configured for biasing components of the memory die 340 (e.g., word lines 210, digit lines 215, sense components 245) to support accessing memory cells 205. The A/D converter 380 can measure, receive, or identify an analog voltage (e.g., a voltage in an analog domain) of the voltage source and generate or provide a digital indication of the voltage (e.g., via a GPIO contact 390-a). Although some examples may be related to evaluations of an analog voltage, other examples may be associated with a voltage, charge, resistance, capacitance, leakage, or other electrical characteristic that is generated, measured, monitored, or identified in the analog domain, among other analog signals or evaluations.

In some examples, a digital indication of an analog characteristic may be communicated to the evaluation device 305 for various operations, such as the evaluation device 305 accepting or rejecting the memory die 340, categorizing the memory die 340 according to a sorting protocol, or performing a calibration of the memory die 340 (e.g., assigning a timing calibration to the memory die 340 based on a voltage of a voltage source, trimming a component to increase or decrease a voltage of a voltage source), among other operations. In some examples, communication of a digital indication may be performed or gated based at least in part on the microprocessor 355 identifying that the digital indication satisfies a threshold (e.g., indicates a particular condition, is associated with a failed or unacceptable analog level). In some examples, operations using the digital indication may be performed internally to the memory die 340 (e.g., by the microprocessor 355), which may include various operational mappings, modifications, calibrations, or other operations performed by or initiated by the microprocessor 355. By implementing an on-board A/D converter 380 (e.g., avoiding a coupling with or through a probe card 330 to perform such a conversion at an A/D converter of the evaluation device 305), the memory die 340 may support faster or more-precise measurements, or may avoid a cost or duration associated with supporting such measurements at an evaluation device 305, or may provide a measurement of an analog signal that would not be otherwise available to the evaluation device 305.

In some examples, the memory die 340 may be configured with an internal register or other storage medium (e.g., fuses, anti-fuses, one-time programmable storage elements, non-volatile storage elements, or various combination thereof) configured for storing a configuration of the memory die 340, such as repair settings, component or circuitry calibrations, or other configuration or calibration. In some examples, an internal register may be written to by the evaluation device 305 based on evaluation information received from the memory die 340 (e.g., in accordance with a repair or calibration command). In some examples, such an internal register may be accessible by the evaluation device 305 or some other device (e.g., a host device 105, another type of evaluation), and accordingly may support a read-back that may be separate from an evaluation process. For example, such information may be read back to support a separate aggregate evaluation of a process for fabricating memory dies 340, or an evaluation of operation of one or more memory dies 340 relative to various repair or calibration settings (e.g., in an evaluation of a robustness or reliability of memory dies 340 having certain repair or calibration solutions), among other evaluations.

Figure 4:
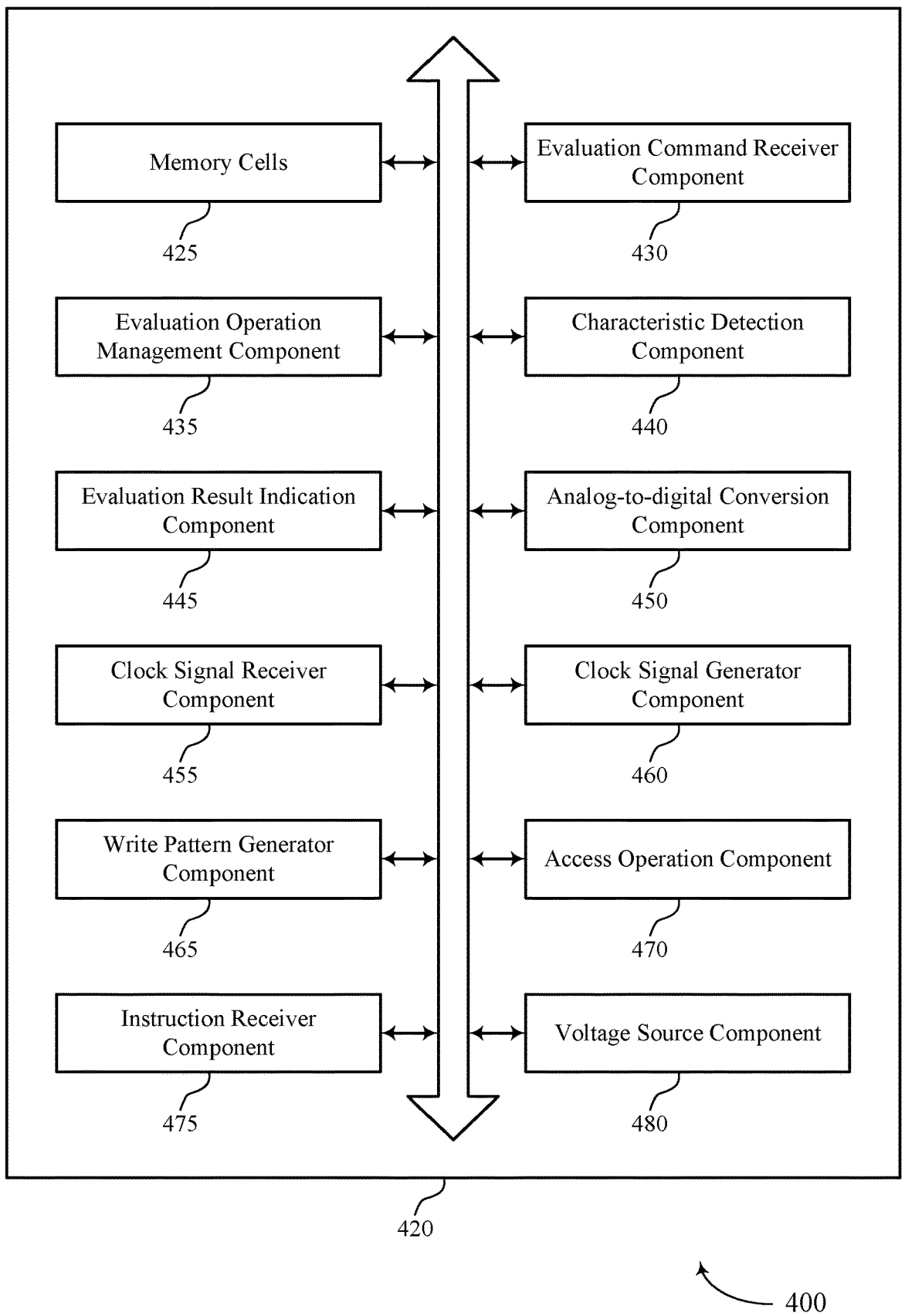
FIG. 4 shows a block diagram of a memory die that supports on-die testing for a memory device in accordance with examples as disclosed herein.

FIG. 4 shows a block diagram 400 of a memory die 420 that supports on-die testing for a memory device in accordance with examples as disclosed herein. The memory die 420 may be an example of aspects of a memory die (e.g., a semiconductor die) as described with reference to FIGS. 1 through 3. The memory die 420, or various components thereof, may be an example of means for performing various aspects of on-die testing for a memory device as described herein. For example, the memory die 420 may include memory cells 425, an evaluation command receiver component 430, an evaluation operation management component 435, a characteristic detection component 440, an evaluation result indication component 445, an analog-to-digital conversion component 450, a clock signal receiver component 455, a clock signal generator component 460, a write pattern generator component 465, an access operation component 470, an instruction receiver component 475, a voltage source component 480, or any combination thereof. Each of these components may communicate, directly or indirectly, with one another (e.g., via one or more buses).

The memory die 420 may support on-die testing for a memory device in accordance with examples as disclosed herein. The evaluation command receiver component 430 may be configured to provide or support a means for receiving a command to perform an evaluation of operating the memory cells 425. The evaluation operation management component 435 may be configured to provide or support a means for performing the evaluation based at least in part on receiving the command. The characteristic detection component 440 may be configured to provide or support a means for detecting a failure or other characteristic of operating the memory cells 425 based at least in part on performing the evaluation. The evaluation result indication component 445 may be configured to provide or support a means for transmitting an indication of the failure or other characteristic based at least in part on the detection.

In some examples, the clock signal receiver component 455 may be configured to provide or support a means for receiving a first clock signal. In some examples, the clock signal generator component 460 may be configured to provide or support a means for generating a second clock signal based at least in part on the first clock signal, the second clock signal having a faster clock rate than the first clock signal. In some examples, the evaluation operation management component 435 may be configured to provide or support a means for performing the evaluation based at least in part on the second clock signal.

In some examples, the command may be received by the evaluation command receiver component 430 from a manufacturing evaluation apparatus. In some examples, the indication of the failure or other characteristic may be transmitted by the evaluation result indication component 445 to the manufacturing evaluation apparatus.

In some examples, to perform the evaluation, the write pattern generator component 465 may be configured to provide or support a means for generating a pattern of signals to effect write operations to memory cells of the memory cells 425 based at least in part on receiving the command to perform the evaluation. In some examples, to perform the evaluation, the access operation component 470 may be configured to provide or support a means for writing data to a set of memory cells included in the memory cells 425 in accordance with the generated write pattern.

In some examples, the access operation component 470 may be configured to provide or support a means for reading second data from the set of memory cells. In some examples, the characteristic detection component 440 may be configured to provide or support a means for determining a difference between the second data and the data written in accordance with the generated write pattern.

In some examples, the access operation component 470 may be configured to provide or support a means for determining to simultaneously activate a plurality of rows of memory cells within the memory cells 425 based at least in part on receiving the command to perform the evaluation. In some examples, the characteristic detection component 440 may be configured to provide or support a means for detecting the failure or other characteristic of operating the memory cells 425 based at least in part on simultaneously activating the plurality of rows.

In some examples, the characteristic detection component 440 may be configured to provide or support a means for detecting an expected outcome of operating the memory cells 425 based at least in part on performing the evaluation. In some examples, the evaluation result indication component 445 may be configured to provide or support a means for transmitting an indication of the expected outcome, where the indication of the expected outcome is associated with a coarser granularity of memory cells than an indication of a failure.

In some examples, the characteristic detection component 440 may be configured to provide or support a means for determining an expected outcome of operating the memory cells 425 based at least in part on performing the evaluation. In some examples, the evaluation result indication component 445 may be configured to provide or support a means for refraining from transmitting an indication of the expected outcome.

In some examples, the instruction receiver component 475 may be configured to provide or support a means for receiving a set of instructions for performing the evaluation. In some examples, the evaluation operation management component 435 may be configured to provide or support a means for performing the evaluation of operating the memory cells 425 in accordance with the received set of instructions based at least in part on receiving the command.

The memory die 420 may support on-die testing for a memory device in accordance with examples as disclosed herein. In some examples, the evaluation command receiver component 430 may be configured to provide or support a means for receiving a command to evaluate a component for operating the memory cells 425. In some examples, the evaluation operation management component 435 may be configured to provide or support a means for generating an analog signal based at least in part on evaluating the component for operating the memory cells 425. The analog-to-digital conversion component 450 may be configured to provide or support a means for converting the analog signal generated based at least in part on the evaluating to a digital indication of the analog signal. In some examples, the evaluation result indication component 445 may be configured to provide or support a means for transmitting, from the semiconductor die, the digital indication of the analog signal.

In some examples, to generate the analog signal, the voltage source component 480 may be configured to provide or support a means for enabling a voltage source of the memory die 420 to generate a voltage of the voltage source, the voltage source associated with generating an internal voltage for accessing the memory cells 425 based at least in part on a voltage supplied to the memory die 420.

In some examples, the analog-to-digital conversion component 450 may be configured to provide or support a means for converting the voltage of the voltage source to a digital indication of the voltage of the voltage source. In some examples, the evaluation result indication component 445 may be configured to provide or support a means for transmitting the digital indication of the voltage of the voltage source.

In some examples, the clock signal receiver component 455 may be configured to provide or support a means for receiving a first clock signal. In some examples, the clock signal generator component 460 may be configured to provide or support a means for generating a second clock signal having a faster clock rate than the received clock signal. In some examples, the evaluation operation management component 435 may be configured to provide or support a means for evaluating the component for operating the memory cells 425 based at least in part on the second clock signal.

In some examples, the instruction receiver component 475 may be configured to provide or support a means for receiving a set of instructions for evaluating the component of the memory die 420. In some examples, the evaluation operation management component 435 may be configured to provide or support a means for evaluating the component for operating the memory cells 425 in accordance with the received set of instructions based at least in part on receiving the command.

Figure 5:
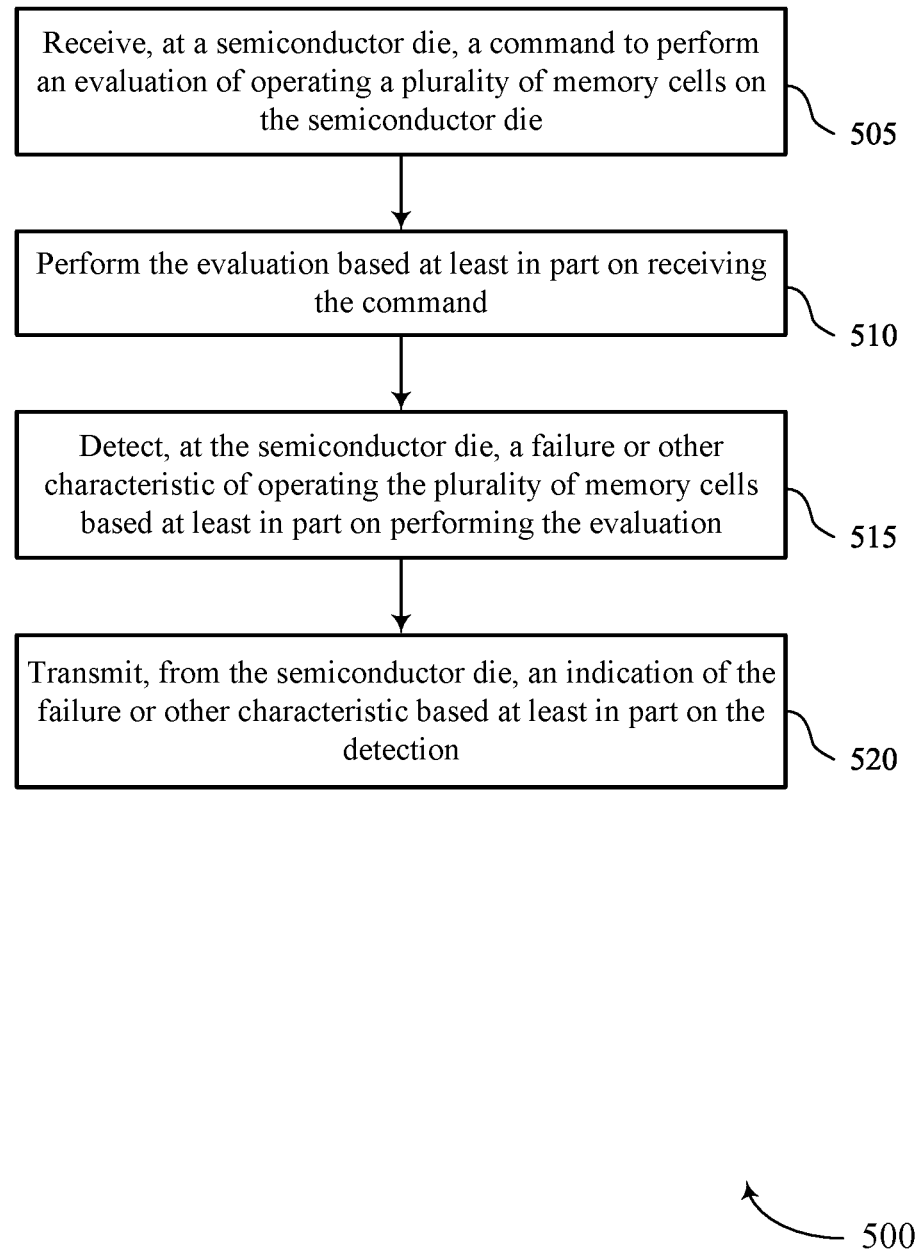
FIGS. 5 and 6 show flowcharts illustrating methods that support on-die testing for a memory device in accordance with examples as disclosed herein.

FIG. 5 shows a flowchart illustrating a method 500 for on-die testing for a memory device in accordance with examples as disclosed herein. The operations of method 500 may be implemented by a memory die (e.g., a semiconductor die) or its components as described herein. For example, the operations of method 500 may be performed by a memory die as described with reference to FIGS. 1 through 4. In some examples, a memory die may execute a set of instructions to control the functional elements of the device to perform the described functions. Additionally or alternatively, the memory die may perform aspects of the described functions using special-purpose hardware.

At 505, the method may include receiving, at a semiconductor die, a command to perform an evaluation of operating a plurality of memory cells on the semiconductor die. The operations of 505 may be performed according to the methods described herein. In some examples, aspects of the operations of 505 may be performed by an evaluation command receiver component 430 as described with reference to FIG. 4.

At 510, the method may include performing the evaluation based at least in part on receiving the command. The operations of 510 may be performed according to the methods described herein. In some examples, aspects of the operations of 510 may be performed by an evaluation operation management component 435 as described with reference to FIG. 4.

At 515, the method may include detecting, at the semiconductor die, a failure or other characteristic of operating the plurality of memory cells based at least in part on performing the evaluation. The operations of 515 may be performed according to the methods described herein. In some examples, aspects of the operations of 515 may be performed by a characteristic detection component 440 as described with reference to FIG. 4.

At 520, the method may include transmitting, from the semiconductor die, an indication of the failure or other characteristic based at least in part on the detection. The operations of 520 may be performed according to the methods described herein. In some examples, aspects of the operations of 520 may be performed by an evaluation result indication component 445 as described with reference to FIG. 4.

In some examples, an apparatus as described herein may perform a method or methods, such as the method 500. The apparatus may include features, circuitry, logic, means, or instructions (e.g., a non-transitory computer-readable medium storing instructions executable by a processor) for receiving, at a semiconductor die, a command to perform an evaluation of operating a plurality of memory cells on the semiconductor die, performing the evaluation based at least in part on receiving the command, detecting, at the semiconductor die, a failure or other characteristic of operating the plurality of memory cells based at least in part on performing the evaluation, and transmitting, from the semiconductor die, an indication of the failure or other characteristic based at least in part on the detection.

Some examples of the method 500 and the apparatus described herein may further include operations, features, circuitry, logic, means, or instructions for receiving a first clock signal at the semiconductor die, generating, at the semiconductor die, a second clock signal based at least in part on the first clock signal, the second clock signal having a faster clock rate than the first clock signal, and performing the evaluation based at least in part on the second clock signal.

In some examples of the method 500 and the apparatus described herein, the command may be received from a manufacturing evaluation apparatus and the indication of the failure or other characteristic may be transmitted to the manufacturing evaluation apparatus.

In some examples of the method 500 and the apparatus described herein, performing the evaluation may include operations, features, circuitry, logic, means, or instructions for generating, at the semiconductor die, a pattern of signals to effect write operations to memory cells of the plurality based at least in part on receiving the command to perform the evaluation and writing data to a set of memory cells included in the plurality of memory cells in accordance with the generated write pattern.

Some examples of the method 500 and the apparatus described herein may further include operations, features, circuitry, logic, means, or instructions for reading second data from the set of memory cells and determining, at the semiconductor die, a difference between the second data and the data written in accordance with the generated write pattern.

Some examples of the method 500 and the apparatus described herein may further include operations, features, circuitry, logic, means, or instructions for determining, at the semiconductor die, to simultaneously activate a plurality of rows of memory cells within the plurality of memory cells based at least in part on receiving the command to perform the evaluation and detecting, at the semiconductor die, the failure or other characteristic of operating the plurality of memory cells based at least in part on simultaneously activating the plurality of rows.

In some examples of the method 500 and the apparatus described herein, detecting, at the semiconductor die, an expected outcome of operating the plurality of memory cells based at least in part on performing the evaluation and transmitting, from the semiconductor die, an indication of the expected outcome, where the indication of the expected outcome may be associated with a coarser granularity of memory cells than the indication of the failure or other characteristic.

Some examples of the method 500 and the apparatus described herein may further include operations, features, circuitry, logic, means, or instructions for determining, at the semiconductor die, an expected outcome of operating the plurality of memory cells based at least in part on performing the evaluation and refraining from transmitting an indication of the expected outcome.

Some examples of the method 500 and the apparatus described herein may further include operations, features, circuitry, logic, means, or instructions for receiving, at the semiconductor die, a set of instructions for performing the evaluation and performing the evaluation of operating the plurality of memory cells in accordance with the received set of instructions based at least in part on receiving the command.

Figure 6:
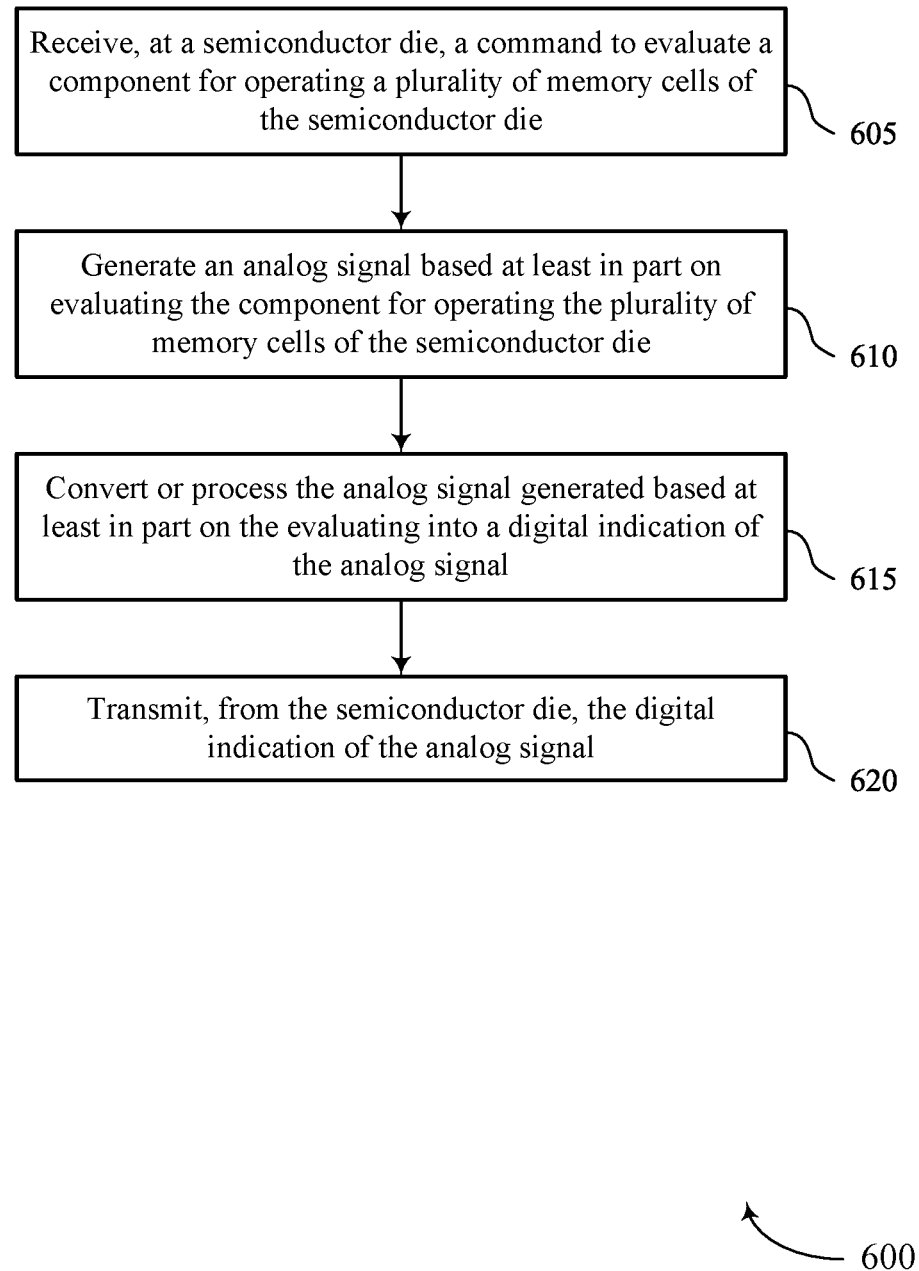

FIG. 6 shows a flowchart illustrating a method 600 for on-die testing for a memory device in accordance with examples as disclosed herein. The operations of method 600 may be implemented by a memory die or its components as described herein. For example, the operations of method 600 may be performed by a memory die as described with reference to FIGS. 1 through 4. In some examples, a memory die may execute a set of instructions to control the functional elements of the device to perform the described functions. Additionally or alternatively, the memory die may perform aspects of the described functions using special-purpose hardware.

At 605, the method may include receiving, at a semiconductor die, a command to evaluate a component for operating a plurality of memory cells of the semiconductor die. The operations of 605 may be performed according to the methods described herein. In some examples, aspects of the operations of 605 may be performed by an evaluation command receiver component 430 as described with reference to FIG. 4.

At 610, the method may include generating an analog signal based at least in part on evaluating the component for operating the plurality of memory cells of the semiconductor die (e.g., an analog signal based on operating the component in response to the command of 605). The operations of 610 may be performed according to the methods described herein. In some examples, aspects of the operations of 610 may be performed by an evaluation operation management component 435 as described with reference to FIG. 4.

At 615, the method may include converting or processing the analog signal generated based at least in part on the evaluating to a digital indication of the analog signal (e.g., converting an analog measurement of the evaluating of the component to a digital indication, processing an analog measurement of the evaluating to generate a digital indication of a characteristic of operating the plurality of memory cells or other component of the memory device). The operations of 615 may be performed according to the methods described herein. In some examples, aspects of the operations of 615 may be performed by an analog-to-digital conversion component 450 as described with reference to FIG. 4.

At 620, the method may include transmitting, from the semiconductor die, the digital indication of the analog signal. The operations of 620 may be performed according to the methods described herein. In some examples, aspects of the operations of 620 may be performed by an evaluation result indication component 445 as described with reference to FIG. 4.

In some examples, an apparatus as described herein may perform a method or methods, such as the method 600. The apparatus may include features, circuitry, logic, means, or instructions (e.g., a non-transitory computer-readable medium storing instructions executable by a processor) for receiving, at a semiconductor die, a command to evaluate a component for operating a plurality of memory cells of the semiconductor die, generating an analog signal based at least in part on evaluating the component for operating the plurality of memory cells of the semiconductor die, converting the analog signal generated based at least in part on the evaluating to a digital indication of the analog signal, and transmitting, from the semiconductor die, the digital indication of the analog signal.

In some examples of the method 600 and the apparatus described herein, generating the analog signal may include operations, features, circuitry, logic, means, or instructions for enabling a voltage source of the semiconductor die to generate a voltage of the voltage source, the voltage source associated with generating an internal voltage for accessing the plurality of memory cells based at least in part on a voltage supplied to the semiconductor die.

Some examples of the method 600 and the apparatus described herein may further include operations, features, circuitry, logic, means, or instructions for converting the voltage of the voltage source to a digital indication of the voltage of the voltage source and transmitting the digital indication of the voltage of the voltage source.

Some examples of the method 600 and the apparatus described herein may further include operations, features, circuitry, logic, means, or instructions for receiving, at the semiconductor die, a first clock signal, generating, at the semiconductor die, a second clock signal having a faster clock rate than the received clock signal, and evaluating the component for operating the plurality of memory cells based at least in part on the second clock signal.

Some examples of the method 600 and the apparatus described herein may further include operations, features, circuitry, logic, means, or instructions for receiving, at the semiconductor die, a set of instructions for evaluating the component of the semiconductor die and evaluating the component for operating the plurality of memory cells in accordance with the received set of instructions based at least in part on receiving the command.

It should be noted that the methods described herein describe possible implementations, and that the operations and the steps may be rearranged or otherwise modified and that other implementations are possible. Further, portions from two or more of the methods may be combined.

An apparatus is described. The apparatus may include a plurality of memory cells on a semiconductor die and circuitry on the semiconductor die. The circuitry may be configured to receive a command to perform an evaluation of operating the plurality of memory cells, perform the evaluation based at least in part on receiving the command, detect a failure or other characteristic of operating the plurality of memory cells based at least in part on performing the evaluation, and transmit an indication of the failure or other characteristic based at least in part on the detection.

In some examples of the apparatus, the circuitry may be configured to receive the command to perform the evaluation and transmit the indication of the failure or other characteristic via a single contact of the semiconductor die, the contact couplable to a bonding pad, a data bus, or a command/address, or any combination thereof.

In some examples of the apparatus, the circuitry may be configured to receive the command, via the single contact, from a manufacturing evaluation apparatus, and transmit the indication of the failure or other characteristic, via the single contact, to the manufacturing evaluation apparatus.

In some examples of the apparatus, the circuitry may be configured to receive a clock signal via a second contact of the semiconductor die, receive the command to perform the evaluation based at least in part on the received clock signal, and transmit the indication of the failure or other characteristic based at least in part on the received clock signal.

In some examples of the apparatus, the circuitry may be configured to generate a second clock signal based at least in part on the clock signal, the second clock signal having a faster clock rate than the received clock signal and perform the evaluation based at least in part on the second clock signal.

In some examples of the apparatus, to perform the evaluation, the circuitry may be configured to generate a pattern of signals to effect write operations to memory cells of the plurality based at least in part on receiving the command to perform the evaluation, and write data to a set of memory cells included in the plurality of memory cells in accordance with the generated write pattern.

In some examples of the apparatus, the circuitry may be configured to read second data from the set of memory cells and determine a difference between the second data and the data written in accordance with the generated write pattern.

In some examples of the apparatus, the circuitry may be configured to determine to simultaneously activate a plurality of rows of memory cells within the plurality of memory cells based at least in part on receiving the command to perform the evaluation, and detect the failure or other characteristic based at least in part on simultaneously activating the plurality of rows.

In some examples of the apparatus, the circuitry may be configured to detect an expected outcome of operating the plurality of memory cells based at least in part on performing the evaluation, and transmit an indication of the expected outcome, where the indication of the expected outcome may be associated with a coarser granularity of memory cells than an indication of a failure.

In some examples of the apparatus, the circuitry may be configured to detect an expected outcome of operating the plurality of memory cells based at least in part on performing the evaluation, and refrain from transmitting an indication of the expected outcome.

In some examples of the apparatus, the circuitry may be configured to receive a set of instructions for performing the evaluation, and perform the evaluation in accordance with the received set of instructions based at least in part on receiving the command.

Another apparatus is described. The apparatus may include a plurality of memory cells on a semiconductor die, and circuitry on the semiconductor die. The circuitry may be configured to receive a command to evaluate a component of the semiconductor die, generate an analog signal based at least in part on evaluating the component of the semiconductor die, convert the analog signal based at least in part on evaluating the component of the semiconductor die to a digital indication of the analog signal, and transmit the digital indication of the analog signal.

In some examples of the apparatus, to generate the analog signal, the circuitry may be configured to enable a voltage source of the semiconductor die to generate a voltage of the voltage source, the voltage source associated with generating an internal voltage for accessing the plurality of memory cells based at least in part on a voltage supplied to the semiconductor die.

In some examples of the apparatus, the circuitry may be configured to convert the voltage of the voltage source to a digital indication of the voltage of the voltage source, and transmit the digital indication of the voltage of the voltage source.

In some examples of the apparatus, the circuitry may be configured to receive the command and transmit the digital indication via a single contact of the semiconductor die, the contact couplable to a bonding pad, a data bus, or a command/address, or any combination thereof.

In some examples of the apparatus, the circuitry may be configured to receive the command, via the single contact, from a manufacturing evaluation apparatus and transmit the digital indication of the analog signal, via the single contact, to the manufacturing evaluation apparatus.

In some examples of the apparatus, the circuitry may be configured to receive a clock signal via a second contact of the semiconductor die, receive the command based at least in part on the received clock signal, and transmit the digital indication based at least in part on the received clock signal.

In some examples of the apparatus, the circuitry may be configured to generate a second clock signal based at least in part on the received clock signal, the second clock signal having a faster clock rate than the received clock signal, and evaluate the component of the semiconductor die based at least in part on the second clock signal.

In some examples of the apparatus, the circuitry may be configured to receive a set of instructions for evaluating the component of the semiconductor die, and evaluate the component of the semiconductor die in accordance with the received set of instructions based at least in part on receiving the command.

Another apparatus is described. The apparatus may include a plurality of memory cells on a semiconductor die, a contact (e.g., a communication contact) on the semiconductor die and configured for receiving signaling to the semiconductor die or for transmitting signaling from the semiconductor die, and a microprocessor on the semiconductor die configured to perform an evaluation of operating the plurality of memory cells and signal, via the contact, a result of performing the evaluation.

In some examples of the apparatus, the microprocessor may be configured to perform the evaluation based at least in part on a command received via the contact.

Some examples of the apparatus may further include a second processor configured to compare, as part of performing the evaluation, first data to be written to the plurality of memory cells in a write operation to second data read from the plurality of memory cells in a read operation following the write operation.

Some examples of the apparatus may further include a second contact (e.g., a second communication contact) on the semiconductor die, and a clock signal generator configured to generate, based at least in part on a first clock signal received via the second contact, a second clock signal having a faster clock rate than the first clock signal, where the microprocessor may be configured to perform the evaluation based at least on part on the second clock signal.

Some examples of the apparatus may further include an analog-to-digital converter on the semiconductor die configured to convert an analog result of performing the evaluation to a digital result of performing the evaluation, where the microprocessor may be configured to signal, via the contact, the digital result of performing the evaluation.

In some examples of the apparatus, the analog-to-digital converter may be configurable to convert an analog voltage, of a voltage source on the semiconductor die for accessing the plurality of memory cells, to a digital indication of the analog voltage.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A semiconductor die, comprising:
   a plurality of memory cells of the semiconductor die; and
   circuitry of the semiconductor die coupled with the plurality of memory cells and configured to cause the semiconductor die to:
      receive, at the semiconductor die via a single contact of the semiconductor die, a command to perform an evaluation of operating the plurality of memory cells of the semiconductor die, the single contact couplable to a bonding pad, a data bus, or a command/address bus, or any combination thereof;

perform, at the semiconductor die, the evaluation based at least in part on receiving the command;

detect, at the semiconductor die, a failure of operating the plurality of memory cells of the semiconductor die based at least in part on performing the evaluation; and transmit, from the semiconductor die via the single contact of the semiconductor die, an indication of the detected failure based at least in part on the detection of the failure at the semiconductor die.

2. The semiconductor die of claim 1, wherein the circuitry of the semiconductor die is configured to cause the semiconductor die to:

receive the command, via the single contact, from a manufacturing evaluation apparatus; and transmit the indication of the detected failure, from the semiconductor die via the single contact, to the manufacturing evaluation apparatus.

3. The semiconductor die of claim 1, wherein the circuitry of the semiconductor die is configured to cause the semiconductor die to:

receive a clock signal via a second contact of the semiconductor die;

receive the command to perform the evaluation based at least in part on the received clock signal; and transmit the indication of the detected failure based at least in part on the received clock signal.

4. The semiconductor die of claim 3, wherein the circuitry of the semiconductor die is configured to cause the semiconductor die to:

generate a second clock signal based at least in part on the clock signal, the second clock signal having a faster clock rate than the received clock signal; and perform the evaluation based at least in part on the second clock signal.

5. The semiconductor die of claim 1, wherein, to perform the evaluation, the circuitry of the semiconductor die is configured to cause the semiconductor die to:

generate a pattern of signals to effect write operations to memory cells of the plurality of memory cells based at least in part on receiving the command to perform the evaluation; and write data to a set of memory cells included in the plurality of memory cells in accordance with the generated write pattern.

6. The semiconductor die of claim 5, wherein the circuitry of the semiconductor die is configured to cause the semiconductor die to:

read second data from the set of memory cells; and determine a difference between the second data and the data written in accordance with the generated write pattern.

7. The semiconductor die of claim 1, wherein the circuitry of the semiconductor die is configured to cause the semiconductor die to:

determine, at the semiconductor die, to simultaneously activate a plurality of rows of memory cells within the plurality of memory cells based at least in part on receiving the command to perform the evaluation at the semiconductor die; and detect the failure at the semiconductor die based at least in part on simultaneously activating the plurality of rows.

8. The semiconductor die of claim 1, wherein the circuitry of the semiconductor die is configured to cause the semiconductor die to:

detect an expected outcome of operating the plurality of memory cells based at least in part on performing the evaluation; and transmit, from the semiconductor die, an indication of the expected outcome, wherein the indication of the expected outcome is associated with a granularity of a first quantity of memory cells and the indication of the detected failure is associated with a granularity of a second quantity of memory cells that is less than the first quantity of memory cells.

9. The semiconductor die of claim 1, wherein the circuitry of the semiconductor die is configured to cause the semiconductor die to:

detect, at the semiconductor die, an expected outcome of operating the plurality of memory cells based at least in part on performing the evaluation at the semiconductor die; and refrain from transmitting an indication of the expected outcome from the semiconductor die.

10. The semiconductor die of claim 1, wherein the circuitry of the semiconductor die is configured to cause the semiconductor die to:

receive, at the semiconductor die, a set of instructions for performing the evaluation; and perform the evaluation at the semiconductor die in accordance with the received set of instructions based at least in part on receiving the command.

11. A method at a semiconductor die, comprising:

receiving, at the semiconductor die via a single contact of the semiconductor die, a command to perform an evaluation of operating a plurality of memory cells of the semiconductor die, the single contact coupled with a bonding pad, a data bus, or a command/address bus, or a combination thereof;

performing, at the semiconductor die, the evaluation based at least in part on receiving the command;

detecting, at the semiconductor die, a failure of operating the plurality of memory cells of the semiconductor die based at least in part on performing the evaluation; and transmitting, from the semiconductor die via the single contact of the semiconductor die, an indication of the detected failure based at least in part on the detection of the failure at the semiconductor die.

12. The method of claim 11, further comprising:

receiving a first clock signal at the semiconductor die;

generating, at the semiconductor die, a second clock signal based at least in part on the first clock signal, the second clock signal having a faster clock rate than the first clock signal; and performing the evaluation at the semiconductor die based at least in part on the second clock signal.

13. The method of claim 12, wherein:

the command is received from a manufacturing evaluation apparatus; and the indication of the detected failure is transmitted from the semiconductor die to the manufacturing evaluation apparatus.

14. The method of claim 11, wherein performing the evaluation comprises:

generating, at the semiconductor die, a pattern of signals to effect write operations to memory cells of the plurality of memory cells based at least in part on receiving the command to perform the evaluation; and writing data to a set of memory cells included in the plurality of memory cells in accordance with the generated write pattern.

15. The method of claim 14, further comprising:
reading second data from the set of memory cells; and
determining, at the semiconductor die, a difference between the second data and the data written in accordance with the generated write pattern.

16. The method of claim 11, further comprising:
determining, at the semiconductor die, to simultaneously activate a plurality of rows of memory cells within the plurality of memory cells based at least in part on receiving the command to perform the evaluation at the semiconductor die; and
detecting, at the semiconductor die, the failure of operating the plurality of memory cells based at least in part on simultaneously activating the plurality of rows.

17. The method of claim 11, further comprising:
detecting, at the semiconductor die, an expected outcome of operating the plurality of memory cells based at least in part on performing the evaluation at the semiconductor die; and
transmitting, from the semiconductor die, an indication of the expected outcome, wherein the indication of the expected outcome is associated with a granularity of a first quantity of memory cells and the indication of the detected failure is associated with a granularity of a second quantity of memory cells that is less than the first quantity of memory cells.

18. The method of claim 11, further comprising:
receiving, at the semiconductor die, a set of instructions for performing the evaluation; and
performing the evaluation at the semiconductor die in accordance with the received set of instructions based at least in part on receiving the command.

19. A semiconductor die, comprising:
a plurality of memory cells of the semiconductor die;
a contact of the semiconductor die configured for receiving signaling to the semiconductor die and for transmitting signaling from the semiconductor die;
a microprocessor of the semiconductor die configured to perform an evaluation of operating the plurality of memory cells based at least in part on a command received via the contact and signal, from the semiconductor die via the contact, a success or failure of performing the evaluation; and
an evaluation processor of the semiconductor die configured to detect the success or failure of operating the plurality of memory cells based at least in part on performing the evaluation.

20. The semiconductor die of claim 19, wherein the evaluation processor is configured to:
detect the success or failure based at least in part on comparing first data to be written to the plurality of memory cells in a write operation to second data read from the plurality of memory cells in a read operation following the write operation.

21. The semiconductor die of claim 19, further comprising:
a second contact of the semiconductor die; and
a clock signal generator configured to generate, based at least in part on a first clock signal received via the second contact, a second clock signal having a faster clock rate than the first clock signal, wherein the microprocessor is configured to perform the evaluation based at least on part on the second clock signal.

22. The semiconductor die of claim 19, further comprising:
an analog-to-digital converter of the semiconductor die configured to convert an analog result of performing the evaluation to a digital result of performing the evaluation, wherein the microprocessor is configured to signal, via the contact, the digital result of performing the evaluation.

23. The semiconductor die of claim 22, wherein the analog-to-digital converter is configurable to convert an analog voltage, of a voltage source of the semiconductor die for accessing the plurality of memory cells, to a digital indication of the analog voltage.

* * * * *